United States Patent [19]
Koizumi

[11] Patent Number: 6,136,387
[45] Date of Patent: Oct. 24, 2000

[54] ION FLOW FORMING METHOD AND APPARATUS

[75] Inventor: Koji Koizumi, Yamanashi-ken, Japan

[73] Assignee: Tokyo Electron Limited, Tokyo, Japan

[21] Appl. No.: 09/122,673

[22] Filed: Jul. 27, 1998

[30] Foreign Application Priority Data

Jun. 4, 1997 [JP] Japan ................................. 9-163423
Jun. 25, 1998 [JP] Japan ................................. 10-178840

[51] Int. Cl.[7] ........................ C23C 16/511; C23C 16/515
[52] U.S. Cl. .......................... 427/562; 427/571; 427/575; 118/723 FI; 118/723 ME; 118/723 MR
[58] Field of Search ................................ 427/562, 563, 427/564, 571, 575; 118/723 ME, 723 MR, 723 ER, 723 IR, 723 FI

[56] References Cited

U.S. PATENT DOCUMENTS

| | | | |
|---|---|---|---|
| 4,452,679 | 6/1984 | Dunn et al. ............................. | 427/562 |
| 4,657,774 | 4/1987 | Satou et al. ............................. | 427/562 |
| 4,996,077 | 2/1991 | Moslehi et al. ........................ | 427/571 |
| 5,212,118 | 5/1993 | Saxena ................................... | 427/562 |
| 5,266,146 | 11/1993 | Ohno et al. ............................. | 427/571 |
| 5,370,779 | 12/1994 | Ohba et al. ............................. | 427/571 |
| 5,427,827 | 6/1995 | Shing et al. ............................ | 427/571 |
| 5,453,305 | 9/1995 | Lee ......................................... | 427/571 |
| 5,525,392 | 6/1996 | Baum et al. ............................ | 427/562 |
| 6,051,120 | 4/2000 | Kishida et al. ...................... | 118/723 FI |

FOREIGN PATENT DOCUMENTS

| | | |
|---|---|---|
| 57-44749 | 9/1982 | Japan . |
| 60-195092 | 10/1985 | Japan . |
| 5-251390 | 9/1993 | Japan . |

*Primary Examiner*—Marianne Padgett
*Attorney, Agent, or Firm*—Oblon, Spivak, McClelland, Maier & Neustadt, P.C.

[57] ABSTRACT

An ion flow forming method and apparatus for attracting ions from a plasma generated in a plasma generation chamber and forming a flow of the ions are disclosed. This ion flow forming apparatus includes the plasma generation chamber having a plasma diffusion outlet port, a processing chamber accommodating a target object, for example, two electrodes arranged between the plasma generation chamber and the target object in the processing chamber, and a potential control unit. This potential control unit controls voltages to be applied to the plasma generation chamber, the two electrodes, and the processing chamber, so that the step of diffusing the plasma generated in the plasma generation chamber in a space between the two electrodes, the ion attraction step of repelling electrons in the diffused plasma toward the plasma generation chamber and attracting the ions in the plasma in an opposite direction, and the ion flow formation step of directing the ions toward the target object are sequentially performed. A method and apparatus including a process of turning on/off the plasma in this cycle are also proposed.

11 Claims, 5 Drawing Sheets

ION FLOW FORMING METHOD AND APPARATUS

BACKGROUND OF THE INVENTION

The present invention relates to an ion flow forming system.

More particularly, the present invention relates to a method and apparatus in, e.g., a plasma processing system, for attracting only positive ions from a plasma and repelling electrons and negative ions to the plasma, thereby forming a positive ion flow directed toward a target object.

Conventionally, as a plasma processing system, a plasma etching system, a plasma CVD system, a plasma ashing system, a plasma cleaning system, and the like are widely known. As such a plasma processing system (to be referred to as a plasma system hereinafter), a system, e.g., a diode parallel plate plasma enhanced system, in which a plasma generation chamber and a plasma processing chamber are integrally formed, and a system, e.g., an ECR plasma enhanced system, in which a plasma generation chamber and a plasma processing chamber are separated, are available.

In the plasma system in which the plasma generation chamber and the plasma processing chamber are separated, a mechanism that guides a plasma generated in the plasma generation chamber or charged particles (e.g., ions) in the plasma to the plasma processing chamber is required. FIG. 6 shows an ECR plasma etching system. In the ECR plasma etching system, a processing chamber 100 is formed in a hermetic processing vessel 102 which can be opened and closed. A susceptor 104 is arranged in the processing vessel 102, and a target object W (e.g., a semiconductor wafer or an LCD glass substrate) is placed on the susceptor 104 through an attraction means, e.g., an electrostatic chuck 106. The electrostatic chuck 106 is formed by mounting a plate electrode 106a between thin films made of an insulating material, e.g., a polyimide resin. When a high-voltage power is applied to the plate electrode 106a from a DC power supply 106b, the wafer W is attracted by the susceptor 104 with the Coulomb force.

The susceptor 104 is provided with a temperature adjusting means comprising a cooling unit 108, a heater 110, and the like in order to adjust the wafer W to a predetermined temperature. A heat transfer gas supply means 112 is arranged in the susceptor 104. A heat transfer gas (e.g., helium gas) is supplied to the wafer W from the lower surface through a plurality of holes in the electrostatic chuck 106, so that the heat transfer efficiency from the susceptor 104 to the wafer W is increased. An RF power supply 116 is connected to the susceptor 104 through a matching circuit 114 to apply a bias RF power to the susceptor 104.

An inlet pipe 118 for introducing a predetermined process gas (a gas mixture of, e.g., carbon fluoride gas, oxygen gas, and argon gas) into the processing chamber 100 is connected to the side wall of the upper portion of the processing vessel 102. An exhaust pipe 120 communicating with an evacuating means (not shown) is connected to the lower portion of the processing vessel 102.

A plasma generation chamber 122 for generating an ECR plasma is connected to the upper portion of the processing chamber 100. A microwave generation chamber 134 is connected to the plasma generation chamber 122 through a waveguide 130. An inlet pipe 124 for introducing a plasma generation gas (e.g., argon gas) B is connected to the upper wall of the plasma generation chamber 122. The gas in the processing chamber 100 and the plasma generation chamber 122 is exhausted by the evacuating means through the exhaust pipe 120. Predetermined process gases are introduced from the inlet pipe 118 and the inlet pipe 124 into the processing chamber 100 and the plasma generation chamber 122, respectively.

A cooling means 126 is arranged on the outer surface of the side wall of the plasma generation chamber 122, and heat generated in the plasma generation chamber 122 is radiated. A magnetic coil 128 is arranged outside the cooling means 126 to surround the plasma generation chamber 122.

The plasma generation chamber 122 is connected to the microwave generation chamber 134 through the waveguide 130 that propagates the microwave. A microwave (e.g., a 2.45-GHz microwave) oscillated by the magnetron (not shown) of the microwave generation chamber 134 propagates to the plasma generation chamber 122 through the waveguide 130 and an insulating wall 132. Electric discharge is excited in the plasma generation chamber 122 by the propagating microwave. A magnetic field of, e.g., 875 Gauss, is applied to the interior of the plasma generation chamber 122 by the magnetic coil 128. During electric discharge, the electrons perform cyclotron motion to generate the ECR plasma for the plasma generation gas B.

Since the predetermined process gas A is introduced into the processing chamber 100, the reactive gas in the process gas is dissociated due to the function of the plasma (electrons) generated in the plasma generation chamber 122, to generate radicals.

A bias RF power is applied from the RF power supply 116 to the susceptor 104 in the processing chamber 100 through the matching circuit 114, and the interior of the processing chamber 100 is evacuated through the exhaust pipe 120. Therefore, the plasma and radicals generated in the plasma generation chamber 122 are guided onto the susceptor 104. A target film (e.g., a silicon oxide film) on the wafer W placed on the susceptor 104 is etched by the plasma and radicals.

This ECR plasma processing system is more suitable to advanced micropatterning of a target object than the conventional diode parallel plate plasma enhanced system and the like. The ECR plasma processing system can easily control etching shape ranging from anisotropic etching to complete isotropic etching. Also, since the ionization rate is high, high-speed etching with less damage can be performed with a low ion energy. Furthermore, since no-electrode discharge is utilized in the processing chamber 100, contamination is few.

In such a plasma processing system in which the plasma generation chamber and the plasma processing chamber are separated, the ions in the plasma generated in the plasma generation chamber must be efficiently attracted into the processing chamber in order to increase the plasma processing efficiency. In the system shown in FIG. 6, however, not only ions necessary for plasma processing but also electrons are diffused and attracted from the plasma generation chamber simultaneously, and are introduced to the processing target in the plasma processing chamber.

Since a force that maintains the electrical neutral state acts between the ions and electrons, it is very difficult to separate the ions and electrons and to introduce only the ions into the processing chamber efficiently. When the electrons and ions (charged particles) are mixed, it is not easy to control only the charged particles with a mechanism combined with an electrode. The advantage of separating only the ions from the plasma arises from this respect. In the plasma ion source, to separate and extract only the ions from the plasma is a prerequisite. In plasma CVD, high-energy injected ions also have an advantage of making the film dense. Inversely, however, if the ion energy is excessively high or the number of ions is excessively large, the ions largely damage the film, which is a disadvantage. In another point of view, ions also have an effect of increasing the film deposition rate (ion induced deposition). When the effect of ion etching is excessively large, an underlying different film is also etched to cause contamination. In any case, to control the injecting ion energy is significant. In the ion source, to control the injecting ion energy is indispensable, as a matter of course.

Furthermore, in the system shown in FIG. 6, it is difficult to control ions mixed with electrons to a desired state, i.e., to cause them to be injected in a desired direction. Therefore, various types of ion flow control means such as an electric field generating means for generating a predetermined electric field in the plasma processing chamber are required.

BRIEF SUMMARY OF THE INVENTION

It is an object of the present invention to effectively attract ions from a plasma generated by a plasma generation mechanism and to direct the ions toward a wafer (substrate).

It is another object of the present invention, in a plasma processing system in which a plasma generation chamber and a plasma processing chamber are separated, to effectively attract ions from a plasma generated by a plasma generation mechanism and to direct the ions toward a target object.

It is still another object of the present invention to solve the above drawbacks in a conventional plasma processing system and its plasma processing method.

It is still another object of the present invention to selectively direct only the ions in the plasma generated in the plasma generation chamber into the plasma processing chamber, so that the target object is efficiently processed with the ions.

It is still another object of the present invention to provide a novel, improved ion flow forming method and introducing apparatus that can attract a relatively large number of ions with a relatively small power.

When a constant potential gradient is continuously applied to a portion from which the ions are to be attracted, the following problem can be explained. The ions that have reached onto the electrode through free motion start to receive an attraction force to a certain degree. Accordingly, the ions also receive a force in the opposite direction with which the ions are dragged by the electrons. For this reason, in this case, the ions cannot be easily attracted. According to the present invention, this problem is solved by repeating the following operations between the electrodes:

(1) ambipolar diffusion (thermal diffusion): without potential gradient
(2) charge separation (ion acceleration): with potential gradient Only the ions are efficiently charge-separated from the plasma introduced to the space between the electrodes.

The ion flow formed by the present invention can be used in various types of applications. For example, an ion flow having a reduced diameter can be used for implantation, and an ion flow having an enlarged diameter can be used for film deposition (ECR CVD).

According to the first aspect of the present invention, there is provided an ion flow forming method of attracting ions from a plasma generated in a plasma generation chamber and forming a flow of the ions, comprising the steps of:

(a) generating the plasma in the plasma generation chamber having a plasma diffusion outlet port;

(b) moving the plasma, generated in the plasma generation chamber, outside the plasma generation chamber through the plasma diffusion outlet port by diffusion;

(c) applying, to the plasma which has moved outside the plasma generation chamber, an electric field in such a direction to repel electrons in the plasma toward the plasma diffusion outlet port and to attract the ions in the plasma in a direction opposite to the electrons, for a shorter period of time than in the steps (a) and (b); and (d) directing the attracted ions toward a target object.

According to the second aspect of the present invention, there is provided an ion flow forming method according to the first aspect, wherein the steps (a) to (d) are repeatedly performed in this order.

According to the third aspect of the present invention, there is provided an ion flow forming method according to the first aspect, wherein at least one of the steps (a) to (d) is performed constantly.

According to the fourth aspect of the present invention, there is provided an ion flow forming method according to the first aspect, wherein the step (c) is performed by applying different voltages to two electrodes arranged at the plasma diffusion outlet port of the plasma generation chamber.

According to the fifth aspect of the present invention, there is provided an ion flow forming method according to the fourth aspect, wherein the step (c) is performed by applying the different voltages to the two electrodes arranged at the plasma diffusion outlet port of the plasma generation chamber in a pulsed manner, and the step (d) is performed by stopping, after the ions are attracted from a space between the two electrodes, application of the voltages to the two electrodes.

According to the sixth aspect of the present invention, there is provided an ion flow forming method according to one of the first to third aspects, further comprising the step (e), having a duration considerably shorter than the step (c), between the steps (b) and (c), wherein the step (e) comprises applying a bias to a first electrode so as to generate an electric field in a direction opposite to that in the step (c) in order to control the ions as a target.

According to the seventh aspect of the present invention, there is provided an ion flow forming method according to any one of the first to third aspects, wherein the step (d) is performed by applying, to a third electrode arranged between the two electrodes and the target object, at least one of an ion accelerating voltage and an ion beam convergence voltage.

According to the eighth aspect of the present invention, there is provided an ion flow forming method according to the fourth aspect, wherein the step (d) comprises the step of dispersing an ion flow in a path of the ions to reach the target object from the two electrodes.

According to the ninth aspect of the present invention, there is provided an ion flow forming method according to the eighth aspect, wherein in the step (c), when the ions contain an ion having a mass different from a predetermined mass, a pulse ratio of an ion acceleration time to a plasma diffusion time is not altered but a period is altered by either one of frequency modulation and amplitude modulation, thereby attracting the ion having the different mass as well.

According to the 10th aspect of the present invention, there is provided an ion flow forming method according to any one of the first, fourth, and fifth aspects, wherein in the step (d), the target object to which the attracted ions are directed is a silicon wafer with a circuit pattern formed thereon.

According to the 11th aspect of the present invention, there is provided an ion flow forming method according to any one of the first, fourth, and fifth aspects, wherein the step (a) is the step of generating the plasma by electron cyclotron resonance.

According to the 12th aspect of the present invention, there is provided an ion flow forming method according to the 11th aspect, wherein the step (c) comprises blocking at least one of introduction of a microwave for generation of an ECR plasma and an external magnetic field.

According to the 13th aspect of the present invention, there is provided an ion flow forming apparatus for attracting ions from a plasma generated in a plasma generation chamber and forming a flow of the ions, the apparatus comprising:

the plasma generation chamber having a plasma diffusion outlet port;

a processing chamber arranged to oppose the plasma diffusion outlet port and accommodating a target object;

two electrodes arranged between the plasma diffusion outlet port of the plasma generation chamber and the target object in the processing chamber; and a potential control unit for controlling potentials of the two electrodes, the potential control unit serving in a diffusion step of moving the plasma, generated in the plasma generation chamber, outside the plasma generation chamber through the plasma diffusion outlet port by diffusion, to perform a control operation so as to make the potentials of the two electrodes equal, in an ion attraction step of repelling electrons in the plasma, which has been diffused outside the plasma generation chamber and moved to a space between the two electrodes, toward the plasma generation chamber and attracting the ions in the plasma toward the processing chamber, to apply, to the two electrodes, different voltages in a pulsed manner so as to form an electric field, which allows the ion attraction step to be performed, in a space between the two electrode; and in the ion flow formation step of directing the attracted ions toward the target object accommodated in the processing chamber, to control potentials of the electrodes not to form an electric field which acts to repel the attracted ions into the plasma.

According to the 14th aspect of the present invention, there is provided an ion flow forming apparatus according to the 13th aspect, wherein generation of the plasma, diffusion of the plasma, attraction of the ions, and formation of the ion flow are sequentially repeated.

According to the 15th aspect of the present invention, there is provided an ion flow forming apparatus according to the 13th aspect, wherein at least one of generation of the plasma and formation of the ion flow is constantly performed.

According to the 16th aspect of the present invention, there is provided an ion flow forming apparatus according to any one of the 14th and 15th aspects, further comprising a short-duration step, having a duration considerably shorter than that of the diffusion step, between the diffusion step and the ion attraction step, wherein in the short-duration step, a bias is applied to a first electrode so as to generate an electric field in a direction opposite to that in the ion attraction step in order to control the ions as a target.

According to the 17th aspect of the present invention, there is provided an ion flow forming apparatus according to the 13th aspect, wherein the potential control unit controls potentials of the plasma generation chamber and the processing chamber in addition to potentials of the two electrodes.

According to the 18th aspect of the present invention, there is provided an ion flow forming apparatus according to the 13th aspect, wherein the processing chamber accommodating the target object comprises an electrode for dispersing the ion flow between the electrodes and the target object.

According to the 19th aspect of the present invention, there is provided an ion flow forming apparatus according to the 18th aspect, wherein the ion flow is used for processing other than ion plantation.

According to the 20th aspect of the present invention, there is provided an ion flow forming apparatus according to the 18th aspect, wherein the electrode for dispersing the ion flow is an electrode with a two-layer structure in which two types of needle-like electrodes to which different potentials are to be applied are arranged alternately.

According to the 21st aspect of the present invention, there is provided an ion flow forming apparatus according to the 13th aspect, wherein each of the electrodes has such a thickness that decreases gradually toward an aperture through which charged particles pass.

According to the 22nd aspect of the present invention, there is provided an ion flow forming apparatus according to the 13th aspect, wherein in the ion flow formation step, when the ions contain an ion having a mass different from a predetermined mass, a pulse ratio of an ion acceleration time to a plasma diffusion time is not altered but a period is altered by either one of frequency modulation and amplitude modulation, thereby attracting the ion having the different mass as well.

According to the 23rd aspect of the present invention, there is provided an ion flow forming apparatus according to one of the 11th, 14th, and 15th aspects, wherein the target object accommodated in the processing chamber is a silicon wafer.

According to the 24th aspect of the present invention, there is provided an ion flow forming apparatus according to one of the 11th, 14th, and 15th aspects, wherein the target object accommodated in the processing chamber is a silicon wafer with a circuit pattern formed thereon.

According to the 25th aspect of the present invention, there is provided an ion flow forming apparatus according to one of the 11th, 14th, and 15th aspects, wherein the plasma generation chamber comprises a mechanism for generating the plasma by electron cyclotron resonance.

According to the 26th aspect of the present invention, there is provided an ion flow forming apparatus according to one of the 11th, 14th, and 15th aspects, wherein the plasma generation chamber comprises a mechanism for generating the plasma by electron cyclotron resonance, and in ion attraction, at least one of introduction of a microwave for generation of an ECR plasma and application of an external magnetic field is blocked.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
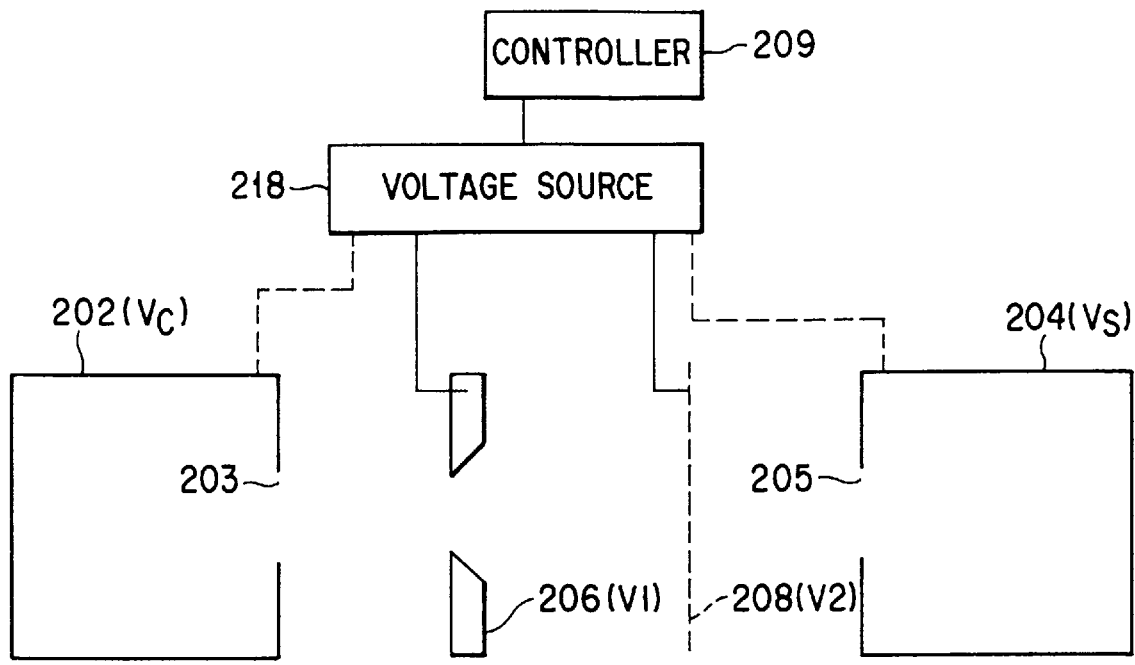
FIG. 1 is a schematic diagram showing an ion flow forming apparatus concerning the present invention.

In order to solve the problems described above in the conventional plasma processing system that a plasma generated in a plasma generation chamber is introduced to a processing chamber, in the present invention, ions in the plasma generated in the plasma generation chamber are attracted by an ion flow forming apparatus to be described later. The attracted ions are introduced to the processing chamber and directed to a target object. Furthermore, in the present invention, electrons in the plasma are repelled in the opposite direction to the ions by the ion flow forming apparatus, i.e., are repelled to the plasma generation chamber. The plasma generation efficiency in the plasma generation chamber is accordingly improved.

An ion flow forming mechanism in an ion flow forming method and apparatus according to the present invention will be described with reference to FIG. 1.

A plasma generation chamber 202 has a plasma generation mechanism (not shown) and a plasma diffusion outlet port 203. The plasma generated by the plasma generation mechanism is diffused outside the chamber through the plasma diffusion outlet port 203 by ambipolar diffusion (diffusion in a state wherein ions, electrons, and radicals coexist).

A processing chamber 204 having an ion inlet port 205 is arranged at a position opposing the plasma generation chamber 202. A target object is accommodated in the processing chamber 204.

Two electrodes (a first electrode 206 and a second electrode 208) through which charged particles can pass are arranged between the plasma generation chamber 202 and processing chamber 204. As each of these electrodes 206 and 208, one having any structure can be employed as far as charged particles can pass through it. For example, an electrode, e.g., the electrode indicated as the first electrode 206, having an aperture at its central portion, and an electrode, e.g., the electrode indicated as the second electrode 208, having a large number of small apertures can be employed.

A voltage from a voltage source 218 is applied to the first and second electrodes 206 and 208 under the control of a controller 209. The voltage source 218 and the controller 209 constitute a potential controller. It is also possible to connect the outer wall surfaces of the plasma generation chamber 202 and processing chamber 204 to the voltage source 218 and to control the potential of the outer wall surfaces of the plasma generation chamber 202 and processing chamber 204 with the controller 209. The arrangement of the plasma generation chamber 202, the first electrode 206, the second electrode 208, and the processing chamber 204 is merely an example, and another arrangement can be employed instead. For example, the plasma diffusion outlet port 203 of the plasma generation chamber 202 and the ion inlet port 205 of the processing chamber 204 may be placed closer to each other or in tight contact with each other, and the first and second electrodes 206 and 208 may be arranged in the processing chamber 204.

In the ion flow forming mechanism shown in FIG. 1, the following steps (a) to (d) are repeatedly performed.

In the step (a), a plasma is generated in the plasma generation chamber 202. A plasma generation gas (the gas B in FIG. 6) is introduced to the plasma generation chamber 202, and the plasma of this gas is generated by the plasma generating mechanism (described above). As described above, this plasma generating mechanism can employ any method for generating a plasma, e.g., a method using an RF power, a method using a microwave, and a method using electron cyclotron resonance (ECR). In this plasma generation step, the plasma generation chamber 202 and the first and second electrodes 206 and 208 can be set at the same potential. Therefore, the plasma generated in the plasma generation chamber 202 is diffused toward the plasma diffusion outlet port 203 by ambipolar diffusion.

In the step (b), the plasma generated in the plasma generation chamber 202 is diffused. The plasma goes out of the plasma diffusion outlet port 203 and is slowly diffused in the space between the plasma generation chamber 202 and the first electrode 206 and then in the space between the first and second electrodes 206 and 208. No electric field is preferably formed in these two spaces for the sake of this diffusion. For this purpose, the plasma generation chamber 202, the first electrode 206, the second electrode 208, and the processing chamber 204 are set at the same potential (e.g., the ground potential). The plasma generated in the plasma generation chamber 202 contains ions, electrons, and radicals. The plasma is molecular-diffused (ambipolar diffusion) while the ions, the electrons, and the radicals coexist in it.

In the step (c), in order to efficiently attract the ions from the plasma, the plasma must be sufficiently diffused in the two spaces. For this purpose, a diffusion time, during which the ions and electrons in the plasma are not recombined with each other but a kind of after glow continues, must be ensured. The diffusion time (T0) can be set through experiments or can be roughly estimated by neglecting a coefficient, in accordance with the following equation:

$$T_0 = L_0/v \quad (1)$$

$$v^2 = kT_i/m_i \quad (2)$$

where T0: the diffusion time

L0: the distance along which the ions enter between the electrodes v: the thermal speed Ti: the ion temperature k: the Boltzmann constant mi: the mass of ions In the step (c), ions are attracted from the plasma. The ions in the plasma that have reached the space between the two grid electrodes tend to attract the electrons due to their charges and not to separate from the electrons. The ions move while dragging the electrons. Accordingly, the ions in the plasma which "stray" into the space between the two electrodes due to diffusion caused by the heat energy are accelerated by the bias potential applied to the susceptor and attracted by the processing chamber at a low efficiency. Hence, it is difficult to efficiently attract the ions from the plasma. It is assumed that this situation is similar to the fact that when attracting electrons from a metal, an extra energy is required due to the value of work function.

Figure 2:
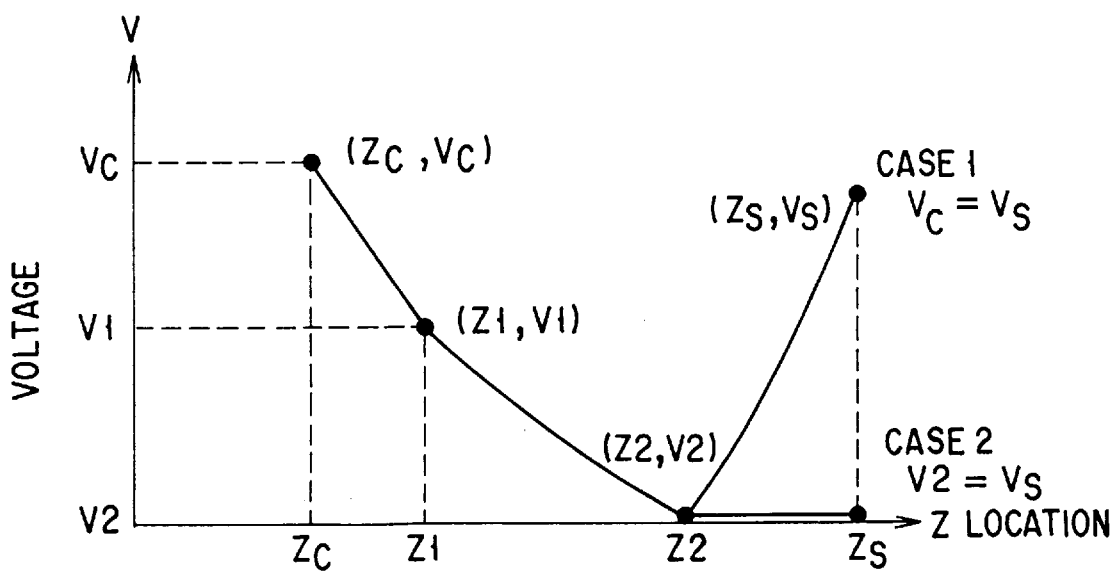
FIG. 2 is a graph indicating voltages applied to respective electrodes and the like in the ion attraction step of the ion flow forming apparatus shown in FIG. 1.

According to the present invention, a pulsed electric field is formed between the two electrodes in order to efficiently attract the ions from the plasma. For this purpose, pulse-controlled ion attracting voltages as shown in FIG. 2 are supplied from the voltage source 218 to the first and second electrodes 206 and 208. As shown in FIG. 2, voltages Vc, $V_1$, $V_2$, and Vs are pulse-controlled potentials respectively applied to the plasma generation chamber, the first electrode, the second electrode, and the processing chamber. Reference symbol Zc denotes the position of the attracting port (chamber); Z1 and Z2, the positions of the first and second electrodes; and Zs, the position of the wafer (substrate). Referring to FIG. 2, in case 1 which is plotted along points (Zc, Vc), (Z1, $V_1$), (Z2, $V_2$), and (Zs, Vc), (Vc=Vs) is established, and the ion acceleration time should not be excessively short or long. In case 2 which is plotted along the points (Vc, Vc), (Z1, $V_1$), (Z2, $V_2$), and (Vs, $V_2$), ($V_2$=Vs) is established, and no problem occurs if the acceleration time is excessively long.

When these ion attracting voltages are supplied to the respective portions, an electric field that effects such a force that the ions are attracted by the second electrode 208 and the electrons are attracted by the first electrode 206 is formed between the two electrodes 206 and 208. Due to the function of this electric field which is formed instantaneously by these pulse-controlled voltages, the ions and electrons in the plasma are separated easily and efficiently. The ions are then accelerated toward the second electrode 208 and pass through the second electrode 208 to be guided to the ion inlet port 205 of the processing chamber 204.

More specifically, when a constant potential gradient is continuously applied to a portion from which the ions are to be attracted, the following problem can be explained. The ions that have reached onto the electrode through free motion start to receive an attracting force to a certain degree. Accordingly, the ions also receive a force in the opposite direction with which the ions are dragged by the electrons. For this reason, in this case, the ions cannot be easily attracted. According to the present invention, this problem is solved by repeating the following operations between the electrodes:

(1) ambipolar diffusion (thermal diffusion): without potential gradient
(2) charge separation (ion acceleration): with potential gradient Only the ions are efficiently charge-separated from the plasma introduced to the space between the electrons.

The electron group in the plasma does not spread or is not dispersed but is repelled to the plasma diffusion outlet port 203 by the function of the electric field formed by the voltage (Vc, $V_1$) applied to the electrodes at the two ends in the space between the first electrode and the plasma generation chamber. Accordingly, the electrons do not collide against the edge of the plasma diffusion outlet port of the plasma generation chamber but are repelled into the plasma generation chamber. Since the electrons are repelled into the plasma generation chamber, the electron density in the plasma generation chamber is increased, and the efficiency with which the plasma is generated by the plasma generation mechanism increases. Since the electron density increases, the potential (Vc) of the plasma generation chamber changes. However, the effect itself of repelling the electrons with the positive potential ($V_1$) applied to the first electrode 206 does not largely change.

In the step (d), the ions guided to the ion inlet port 205 of the processing chamber 204 strike the target object. In the step (c), the ions which have been attracted from the plasma and accelerated toward the second electrode 208 pass through the second electrode 208 and are directed toward the ion inlet port 205 of the processing chamber 204. While the ions are directed from the second electrode 208 to the ion inlet port 205, when the potential $V_2$ of the second electrode 208 and the potential Vs of the processing chamber (and of the target object) are maintained at the levels shown in FIG. 2, the ions that have passed through the second electrode 208 are decelerated by the function of the electric field formed by the potentials $V_2$ and Vs. Therefore, at a time point when the ions almost reach the maximum speed (e.g., a time point immediately after the group of the ions passes through the second electrode 208), the electric field must be extinguished or an electric field that accelerates the ions to the ion inlet port 205 must be formed. The electric field can be extinguished by at least setting the voltages $V_2$ and Vs at the same potential. However, from the viewpoint of eliminating the influence from other voltages Vc and $V_1$ as well, it is preferable to set the voltages Vc, $V_1$, $V_2$, and Vs of all the portions at the same potential. In order to form an electric field for accelerating the ions toward the ion inlet port 205, the voltage $V_2$ can be set to a potential higher than Vs.

When the electric field is distinguished or an electric field in the opposite direction is formed in this manner, the ions strike the target object without being decelerated by the electric field. In this process, even if an energy component having a high electron energy distribution exceeds a potential barrier formed by the electrode and the electrons are accordingly charged up to the surface of the target object to a certain degree, the electrons are neutralized by ions that will strike later. Since only the ions selectively strike the wafer, the ion injection direction will not be disturbed by the electrons. Since the striking ions are not recombined with the electrons to distinguish but the ion density increases, the wafer can be processed uniformly. The steps (a) to (d) will be described in more detail.

Figure 6:
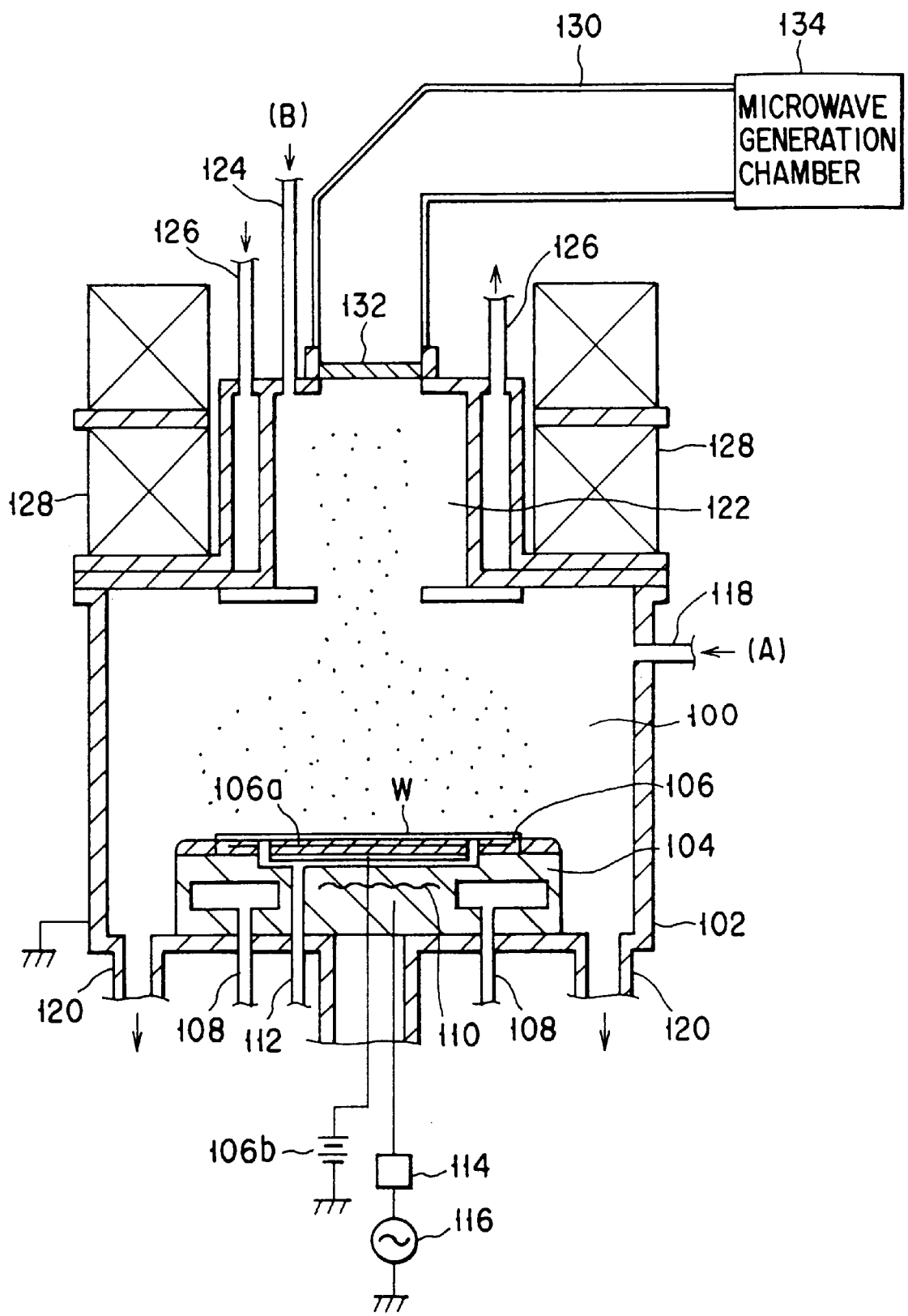
FIG. 6 is a schematic diagram of the ECR plasma thin film deposition system as a related art (not prior art).

In the step (a), as the plasma generation mechanism, any mechanism that generates a plasma can be employed. For example, an RF plasma generation mechanism, a capacitive coupling type plasma generation mechanism, a parallel plate type plasma generation mechanism, an inductive coupling type plasma generation mechanism, a microwave plasma generation mechanism, or an ECR plasma generation mechanism can be employed. In particular, the ECR plasma generation mechanism which was described with reference to FIG. 6 is one of the preferable mechanisms.

In the step (b), while the plasma is sufficiently generated, when introduction of the microwave or the like is stopped (application of magnetic field is stopped), the plasma can be freely diffused.

In the step (c), while the ions are attracted from the plasma, the plasma generation microwave or the like can be made not to be introduced into the plasma generation chamber (e.g., application of the magnetic field is stopped).

The ratio of two different time, i.e., the moving time by diffusion in the step (b) to the time required for acceleration of the electric field of the step (c) does not depend on the mass of the ions but is determined by only the ion temperature (thermal speed) and the bias voltage. Accordingly, concerning an arbitrary ion, the time ratio of the pulsed bias voltage can be determined by the same parameter set by the ion temperature and bias voltage. As a result, the control method of the pulsed bias voltage is simplified. When ions having different masses are mixed, a control operation of modulating the frequency and/or amplitude without changing the waveshape can also be performed. When the ions are heavy, a moment during modulation of a large-amplitude long period is effective.

Figure 3:
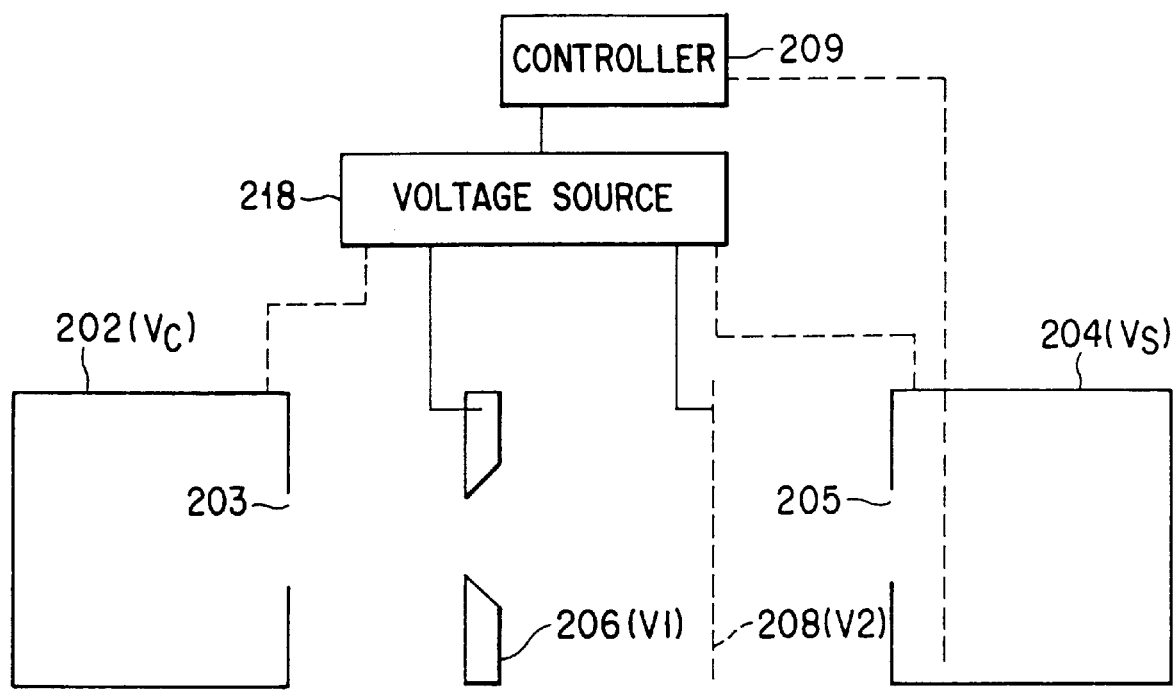
FIG. 3 is a schematic diagram of the ion flow forming apparatus shown in FIG. 1 in which the third electrode is further arranged.

In the step (d), a negative potential can be applied to either the second electrode 208 or the processing chamber (target object). When the negative potential is applied to the second electrode 208, the motion of ions from the second electrode 208 to the target object can be controlled by a third electrode (see FIG. 3), so that the incident direction of the ions onto the target object can be changed. When a negative potential is applied to the target object, a pressure range in which the accelerated ions collide against each other several times between the electrodes is often employed. Since the electrons are separated, however, recombination does not substantially occur. It is limited to only charge-exchange injection. When the bias voltage is applied to the third electrode 110, unless it is based on a state in which electric field acceleration does not occur, this bias potential is difficult to set.

Figure 4:
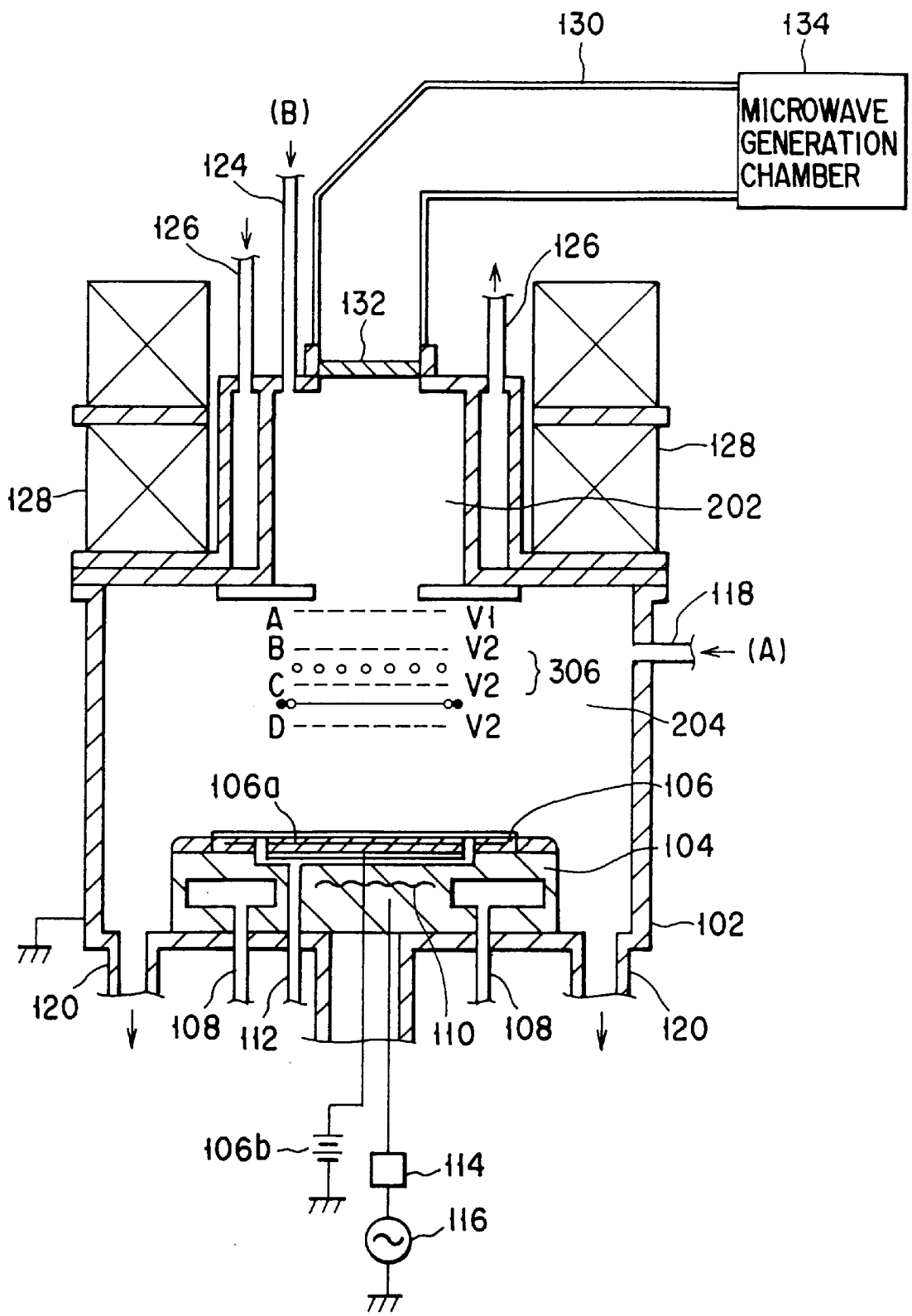
FIG. 4 is a schematic diagram of the ion flow forming apparatus shown in FIG. 1 in which an ion dispersing unit is further arranged.

In the step (d), as an electrode structure for dispersing the ion incident direction, two types of needle-like electrodes 306 having different potentials can be alternately arranged, as shown in FIG. 4. Note that needle-like electrodes indicated as hollow circles ○ are electrodes used for holding the constant potential, and that needle-like electrodes indicated as black circles ● are electrodes used for attracting the ions. In the ion attraction step, the electrode potential is fixed at a negative potential, so the ion attracting effect on the electrode surface will not be decreased. This is because electrons having negative charges are repelled by the electrodes having a negative potential. In the ion repelling step, the electrode is maintained at a positive potential. In this case, since the ions and electrodes repel each other, sputter etching of the electrode caused by ions can hardly occur.

As an example of this electrode structure, the electrode between B and C may be an electrode that oscillates the ion locus up and down along the surface of the sheet of drawing, while the electrode between C and D may be an electrode that oscillates the ion locus in the right-to-left direction of the surface of the sheet of drawing. The potentials of the respective electrodes can be set to satisfy $V_1=Vc$ (c=chamber), $V_2=Vs$ (s=substrate), ○=$V_2$, ●=$V_3$, and $V_1>V_2>V_3$. It is also possible to satisfy $V_2<V_3$.

The electrons do not enter the processing chamber but are repelled to the plasma generation chamber to increase the electron density in the plasma generation chamber. Therefore, the ionization degree in the plasma generation chamber is increased and the plasma generation efficiency is improved.

The above steps (a) to (d) are repeated with predetermined time interval. This repetition time is calculated, and set, from the time during which the plasma accompanying the electrons and ions is sufficiently diffused in the diffusion area, and the time during which only the ions in the diffusion area can be selectively, efficiently attracted. When, e.g., the duration of the ion attraction step (c) is set to be relatively shorter than that of the plasma diffusion step, the plasma accompanying the electrons and ions is diffused in the diffusion area in a desired state, and the ions are efficiently attracted toward the second electrode 208.

If pulsed control is stopped and the duration of the ion attraction step is set to be almost the same as that of the plasma diffusion step, the processing time is disadvantageously almost doubled.

The time required for applying the ion attracting potential to the space between the first and second electrodes and attracting the ions from the plasma is calculated in accordance with the following equation:

$$T_1^2 = 2L_g/a \tag{3}$$

$$a = (e/m_i)(V/L_g) \quad \text{(for } L_0 < L_g\text{)} \tag{4}$$

where $T_1$: the time required for attracting the ions from the plasma
$L_g$: the electrode-to-electrode distance
a: the acceleration of ions
e: the elementary electric charge ($1.6 \times 10^{-19}$ (c))
$m_i$: the mass of ions
V: the bias (acceleration) voltage The time ratio (relative pulse width) of the time ($T_1$) required for attracting the ions from the plasma to the plasma diffusion time ($T_0$) is calculated in accordance with the following equation:

$$(T_1/T_0)^2 = [2L_g M_i L_g/(eV)] \cdot (kT_i/M_i) \cdot L_0^{-2} = (L_g/L_0)^2 \cdot [2kT_i/(eV)] \tag{5}$$

where $L_g$: the electrode-to-electrode distance
$M_i$: the mass of ions
e: the elementary electric charge
V: the bias (acceleration) voltage
k: the Boltzmann constant
$L_0$: the distance along which the ions enter the space between the electrodes
$T_i$: the ion temperature The lower limit of the relative pulse width of the pulse-controlled ion attracting voltage applied between the first and second electrodes 206 and 208 does not depend on the mass of ions. In setting the actual pulse width, it suffices if the value of a coefficient $L_g/L_0$ is changed in accordance with determination as to which degree the ions are allowed to enter the space between the electrodes. If the two different distances $L_g$ and $L_0$ described above are clearly distinguished from each other, the pulse width is obtained as one having a range. The lower limit of the frequency of the pulse width depends on the electrode-to-electrode distance and the like, and is almost 3 kHz to 10 kHz. Accordingly, even if the frequency of the pulse width is set to about 100 kHz, this value is not particularly excessively large.

Examples of values of the ion attracting bias V and the ratio of the time ($T_1$) required for electric field acceleration to the time ($T_0$) of motion caused by thermal diffusion are shown in the following table.

|  | case 1 | case 2 |
|---|---|---|
| ION ATTRACTING BIAS | 500V | 125V |
| $T_1/T_0$ | 0.01 | 0.02 |

One embodiment of the ion flow forming mechanism according to the present invention has been described in the above manner. As another embodiment, a plasma processing system employing this ion flow forming mechanism will be described. This ion flow forming mechanism can be employed in various types of plasma processing systems or a plasma processing system for processing various types of target objects. An ECR plasma thin film deposition system for forming a thin film on a semiconductor wafer will be described herein as a typical embodiment.

Figure 5:
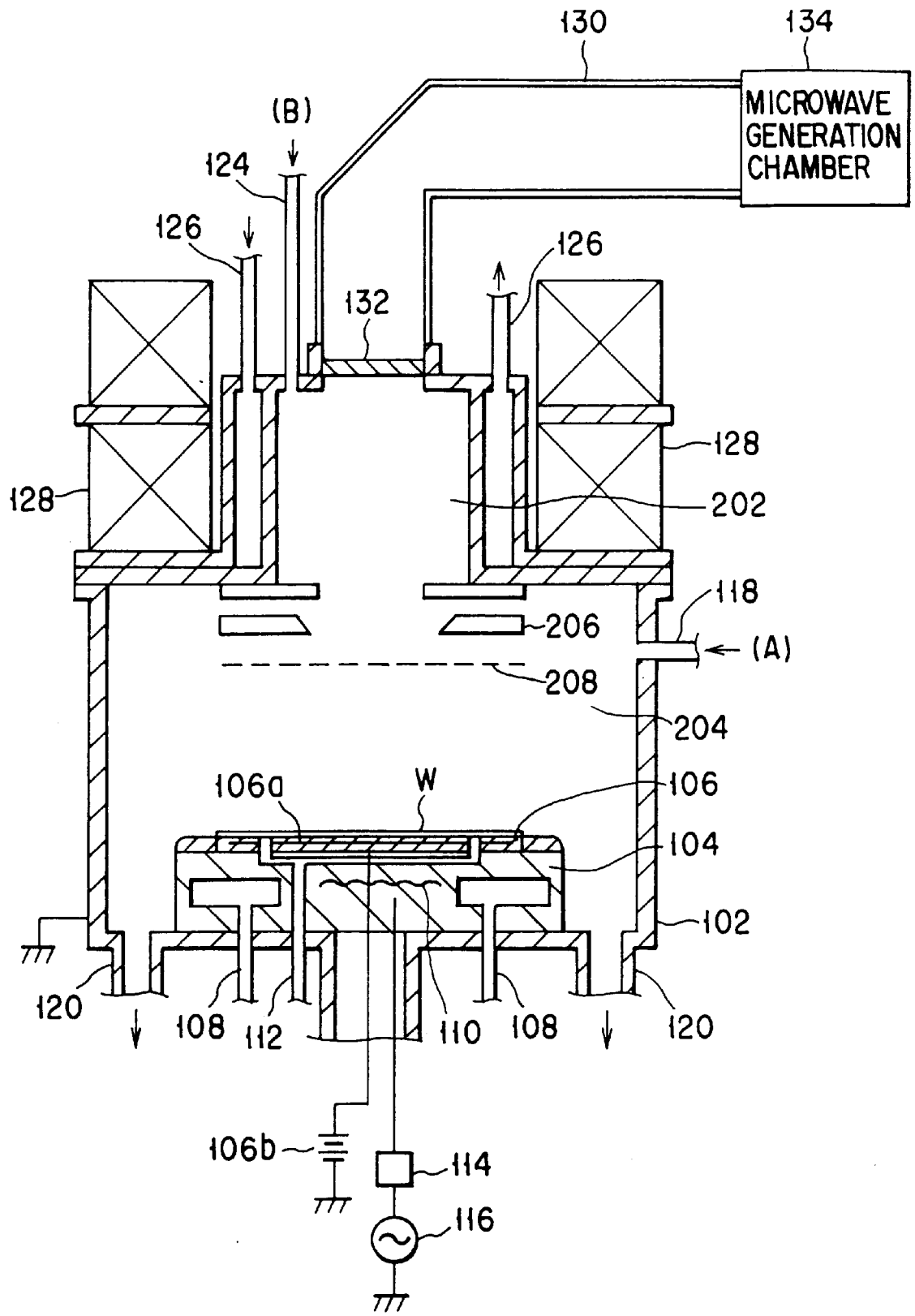
FIG. 5 is a schematic diagram of an ECR plasma thin film deposition system to which the ion flow forming mechanism shown in FIG. 1 is applied.

Referring to FIG. 5, in an ECR plasma thin film deposition system, a first electrode 206 and a second electrode 208 identical to those shown in FIG. 1 are arranged in a processing chamber 204, and a power supply (not shown) controlled by a controller is connected to the first and second electrodes 206 and 208. The power supply is also connected to a plasma generation chamber and the processing chamber to apply predetermined voltages to them. This ECR plasma thin film deposition system basically has substantially the same arrangement as that of the system shown in FIG. 6 except for the first electrodes 206 and 208, the controller, and the power supply.

Under the control of the controller, the voltages from the power supply to the first and second electrodes 206 and 208 (and furthermore to the plasma generation chamber and the processing chamber) are synchronously supplied by the controller.

In plasma processing, the following steps similar to those described with reference to FIG. 1 are performed.

In the step (a), a plasma is generated in a plasma generation chamber 202.

In the step (b), the plasma generated in the plasma generation chamber 202 is diffused. No voltage is applied to the first and second electrodes 206 and 208 by the controller. No electric field exists between the electrodes 206 and 208, and an environment in which the plasma is diffused by ambipolar diffusion is formed between them. This environment is maintained during a period of time required for allowing the plasma to be sufficiently diffused between the two electrodes.

In the step (c), ions are attracted from the plasma. After the plasma is sufficiently diffused between the two electrodes 206 and 208 in the step (b), voltages for attracting the ions from the plasma are applied to the first and second electrodes 206 and 208. As a result, the ions attracted from the plasma are accelerated toward the second electrode 208, and the electrons are repelled toward the first electrode 206.

In the step (d), the ions guided to the ion inlet port of the processing chamber 204 strike the target object. When the potentials of the wall of the plasma chamber and the potential of the target object are set the same, the ions attracted from the plasma and accelerated toward the second electrode 208 pass through the second electrode 208 and are repelled toward the second electrode 208 by the function of the electric field formed by the second electrode 208. In order to eliminate this function, after the ion group passes through the second grid electrode, application of the voltages to the first and second electrodes 206 and 208 can be stopped.

Through the steps (a) to (d) described above, only the ions are introduced into the processing chamber, and the processing operations, e.g., thin film formation and etching, in the processing chamber need be controlled concerning only the behavior of the ions. This control can be executed accurately. In thin film formation, a large bias need not be applied to the substrate in order to increase the injecting ion density.

In this embodiment, the third electrode (not shown) can further be provided to guide the ions to the target object. After the ions pass through the third electrode, a voltage is applied from the power supply to the third electrode to cause the ions to be directed toward the target object.

As an electrode structure for dispersing the ion flow direction, two types of needle-like electrodes 306 having different potentials, as shown in FIG. 4, can be arranged alternately.

Since the ion flow forming mechanism according to the present invention is employed, in the ECR plasma thin film deposition system according to this embodiment, the ions and electrons in the plasma can be separated efficiently. The ions are efficiently attracted from the plasma, and the high-density ions strike the target object at a desired incident angle.

Since the electrons separated from the plasma are repelled to the plasma generation chamber, a larger number of electrons are supplied to the plasma generation chamber 202 to generate a high-density plasma. Since the ion attraction step (d) can be performed in a pulse manner within a relatively short period of time when compared to the plasma diffusion step (b), a required number of ions can be obtained within a short period of time, and the throughput can be improved when compared to a control operation performed with a smooth waveform.

The target object arranged in the plasma processing chamber can be subjected to desired uniform processing with only high-density ions. The ions serve to etch the shoulder of a pattern, e.g., a groove or hole, on the wafer, thereby increasing the deposition rate. The radicals in the plasma introduced into the processing chamber are continued to be diffused without being influenced by the electric field. The radicals are deposited on the surface of the target object, which is activated by the ions, comparatively slowly. The amount of process gas component which is deposited on the surface of the target object in accordance with 1-cycle processing of electrode potential control is less than 10 atomic layers and a maximum of several atomic layers. When the surface reaction probability, i.e., the deposition coefficient, is small, a case wherein the process gas component is deposited by not more than 1 atomic layer is sufficiently anticipated. In other words, a phenomenon in which most of the particles reach the surface which is activated by the ions is anticipated. Therefore, the rate with which the process gas component attaches to the surface of the target object is sufficiently increased by the ions. Accordingly, a thin film is efficiently formed on the surface of the target object.

The preferred embodiments of the present invention have been described with reference to the accompanying drawings. Note that the present invention is not limited to these arrangements.

For example, although a pulse-controlled ion attracting voltage and an ion accelerating voltage are used in the above embodiments, the present invention is not limited to this arrangement. The present invention can be practiced if an AC power which is half-wave rectified is used. Accordingly, although the pulsed electric field which is applied to attract the ions from the plasma is preferably a rectangular pulsed electric field, the present invention is not limited to this. The voltage need not be a rectangular voltage, but any voltage can be employed as far as it has a duration of a predetermined period of time, and an electric field which is formed by a half-wave rectified AC power can be employed.

In the above embodiment, an ECR plasma thin film deposition system for forming a thin film on the surface of a semiconductor wafer has been described. The present invention is not limited to this embodiment, but can be applied to various types of plasma processing systems, e.g., a plasma etching system, a plasma sputtering system, and an ion injection system. Concerning the target object, it is not limited to a silicon wafer, but can be an electronic component, e.g., an LCD glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An ion flow forming method of attracting ions from a plasma generated in a plasma generation chamber and forming a flow of the ions, comprising the steps of:

(a) generating the plasma in said plasma generation chamber having a plasma diffusion outlet port;

(b) moving at least a portion of the plasma, generated in said plasma generation chamber, outside said plasma generation chamber through said plasma diffusion outlet port by diffusion;

(c) extracting the ions by applying, to the plasma which has moved outside said plasma generation chamber, an electric field in a first direction to repel electrons in the plasma toward said plasma diffusion outlet port and to attract the ions in the plasma in a second direction opposite to the electrons, by applying in a pulsed manner first and second voltages to respective of first and second electrodes, wherein the first voltage is higher than the second voltage, and the first electrode and the second electrode are sequentially arranged between respective of the plasma diffusion outlet port of the plasma generation chamber and a target object; and (d) directing the attracted ions toward the target object.

2. A method according to claim 1, wherein the steps (a) to (d) are repeatedly performed in sequential order from (a) to (d).

3. A method according to claim 1, wherein the step (a) is performed constantly.

4. A method according to claim 1, wherein the step (d) is performed by stopping, after the ions are extracted toward the object from a space between said first and second electrodes, application of the voltages to said first and second electrodes.

5. A method according to claim 1, wherein the step (d) is performed by applying, to a third electrode arranged between said first and second electrodes and the target object, at least one of an ion accelerating voltage and an ion beam convergence voltage.

6. A method according to claim 1, wherein the step (d) comprises the step of dispersing the ion flow in a path of the ions to reach the target object from said first and second electrodes.

7. A method according to claim 1, wherein the electric field in the step (c) has a pulse frequency of 3 KHz to 100 KHz.

8. A method according to claim 7, wherein in the step (c), when the ions contain an ion having a mass different from a predetermined mass, the ion having the different mass is extracted by performing either one of frequency modulation and amplitude modulation, while keeping unchanged a pulse ratio of an ion acceleration time to a plasma diffusion time.

9. A method according to claim 1, wherein in the step (d), the target object to which the attracted ions are directed is a silicon wafer with a circuit pattern formed thereon.

10. A method according to claim 1, wherein the step (a) is the step of generating the plasma by electron cyclotron resonance.

11. A method according to claim 10, wherein the step (c) further comprises blocking introduction of at least one of an external magnetic field and microwaves, for generation of the electron cyclotron resonance plasma.

* * * * *

UNITED STATES PATENT AND TRADEMARK OFFICE
CERTIFICATE OF CORRECTION

PATENT NO. : 6,136,387
DATED : October 24, 2000
INVENTOR(S): Koji Koizumi

It is certified that an error appears in the above-identified patent and that said Letters Patent is hereby corrected as shown below:

On the title page, [Item 75], the Inventor's city of residence is listed incorrectly, and on the title page, [Item 30], the Foreign Application Priority Data is incorrect. Item [75] and Item [30] should read as follows:

[75] Inventor: Koji Koizumi, Kitakoma-gun, Japan

[30] Foreign Application Priority Data

Jun. 25, 1998 [JP] Japan ...............................10-178840

Signed and Sealed this

Fifteenth Day of May, 2001

Attest:

NICHOLAS P. GODICI

Attesting Officer       Acting Director of the United States Patent and Trademark Office